United States Patent
Okuda et al.

(10) Patent No.: US 9,401,192 B2
(45) Date of Patent: Jul. 26, 2016

(54) FERROELECTRIC MEMORY DEVICE AND TIMING CIRCUIT TO CONTROL THE BOOST LEVEL OF A WORD LINE

(71) Applicant: FUJITSU SEMICONDUCTOR LIMITED, Yokohama-shi, Kanagawa (JP)

(72) Inventors: Masaki Okuda, Shinjuku (JP); Keizo Morita, Sagamihara (JP); Tomohisa Hirayama, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/479,025

(22) Filed: Sep. 5, 2014

(65) Prior Publication Data
US 2015/0109875 A1 Apr. 23, 2015

(30) Foreign Application Priority Data

Oct. 17, 2013 (JP) ................................. 2013-216500

(51) Int. Cl.
*G11C 8/08* (2006.01)
*G11C 8/10* (2006.01)
*G11C 8/18* (2006.01)

(52) U.S. Cl.
CPC .. *G11C 8/08* (2013.01); *G11C 8/10* (2013.01); *G11C 8/18* (2013.01)

(58) Field of Classification Search
CPC ...... G11C 11/22; G11C 11/2293; G11C 8/18; G11C 8/10; G11C 8/08
USPC ............................................ 365/230.06, 145
See application file for complete search history.

(56) References Cited

U.S. PATENT DOCUMENTS

| 5,642,326 | A | 6/1997 | Sakurai et al. |
| 6,178,138 | B1 * | 1/2001 | Derbenwick et al. ...... 365/233.1 |
| 6,330,180 | B2 * | 12/2001 | Noro ....................... G11C 11/22 365/145 |
| 6,950,326 | B2 | 9/2005 | Suzuki |
| 2002/0036915 | A1 * | 3/2002 | Ashikaga ............... G11C 11/22 365/145 |
| 2005/0195639 | A1 * | 9/2005 | Fukushi et al. ............... 365/149 |

FOREIGN PATENT DOCUMENTS

| JP | 63-255897 | A | 10/1988 |
| JP | 04-053087 | A | 2/1992 |
| JP | 05-012867 | A | 1/1993 |
| JP | 06-349270 | A | 12/1994 |
| JP | 08-102187 | A | 4/1996 |
| JP | 2686130 | B2 | 8/1997 |
| JP | 2000-285680 | A | 10/2000 |
| JP | 2004-079124 | A | 3/2004 |
| JP | 2012-127776 | A | 7/2012 |

* cited by examiner

*Primary Examiner* — Alexander Sofocleous
*Assistant Examiner* — Alfredo Bermudez Lozada
(74) *Attorney, Agent, or Firm* — Arent Fox LLP

(57) ABSTRACT

A semiconductor memory device includes a memory cell array, a word line decoder, a time determination signal generation circuit, and a timing circuit. The memory cell array is configured to include a plurality of memory cells, and the word line decoder is configured to control selection and a voltage level of a word line connected to each of the memory cells. The time determination signal generation circuit is configured to generate a time determination signal indicating a determination time, the determination time being a reference by which a change in a command is determined, and the timing circuit is configured to determine the change in the command from the time determination signal and generate a control signal which controls whether or not a selected word line is pre-charged.

13 Claims, 17 Drawing Sheets

["/CE=L"-PERIOD IS SHORTER THAN "DT=H"-PERIOD]

["/CE=L"-PERIOD IS LONGER THAN "DT=H"-PERIOD]

FERROELECTRIC MEMORY DEVICE AND TIMING CIRCUIT TO CONTROL THE BOOST LEVEL OF A WORD LINE

CROSS-REFERENCE TO RELATED APPLICATION

This application is based upon and claims the benefit of priority of the prior Japanese Patent Application No. 2013-216500, filed on Oct. 17, 2013, the entire contents of which are incorporated herein by reference.

FIELD

The embodiments discussed herein are related to a semiconductor memory device.

BACKGROUND

For semiconductor memory devices, cost reduction by fine processing has accelerated with an advance in semiconductor manufacturing processes and decreasing parasitic capacitance due to shrinkage in dimensions has further led to a reduction in consumption current.

However, as miniaturization in semiconductor manufacturing processes advances channel length of a transistor shortens, causing an increase in an off-state current of the transistor.

Semiconductor memory devices such as a DRAM (Dynamic Random Access Memory) and FeRAM (Ferroelectric Random Access Memory: FRAM (a registered trademark)) of recent years, for example, are configured to access a predetermined memory cell by boosting the level of a word line in a plurality of steps.

In this way, semiconductor memory devices such as an FeRAM of recent years, for example, access a predetermined memory cell by boosting the level of a word line in a plurality of steps. Moreover, as miniaturization in semiconductor manufacturing processes advances, channel length of a transistor shortens, leading an increase in an off-state current.

Therefore, when the level of a word line is boosted, for example, because a leakage current through a transistor controlling the boost increases, it becomes difficult to boost the level of the word line sufficiently. There is a possibility that this phenomenon takes place when, for example, a period from a time at which a CPU controlling a semiconductor memory device outputs a read command to the semiconductor memory device to a time at which the CPU outputs a succeeding write command is long.

In the past, various semiconductor memory devices which carry out a memory access by boosting the level of a word line have been proposed.

Patent Document 1: Japanese Laid-open Patent Publication No. H06-349270
Patent Document 2: Japanese Laid-open Patent Publication No. S63-255897
Patent Document 3: Japanese Laid-open Patent Publication No. H04-053087
Patent Document 4: Japanese Laid-open Patent Publication No. H05-12867
Patent Document 5: Japanese Laid-open Patent Publication No. H08-102187
Patent Document 6: Japanese Laid-open Patent Publication No. 2000-285680
Patent Document 7: Japanese Laid-open Patent Publication No. 2012-127776
Patent Document 8: Japanese Patent No. 2686130
Patent Document 9: Japanese Laid-open Patent Publication No. 2004-079124

SUMMARY

According to an aspect of the embodiments, a semiconductor memory device, including a memory cell array, a word line decoder, a time determination signal generation circuit, and a timing circuit is provided.

The memory cell array is configured to include a plurality of memory cells, and the word line decoder is configured to control selection and a voltage level of a word line connected to each of the memory cells.

The time determination signal generation circuit is configured to generate a time determination signal indicating a determination time, the determination time being a reference by which a change in a command is determined, and the timing circuit is configured to determine the change in the command from the time determination signal and generate a control signal which controls whether or not a selected word line is pre-charged.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First, before a semiconductor memory device according to the embodiment is described in detail, an example of a semiconductor memory device and a problem thereof are described referring to FIGS. 1 to 10B.

Figure 1:
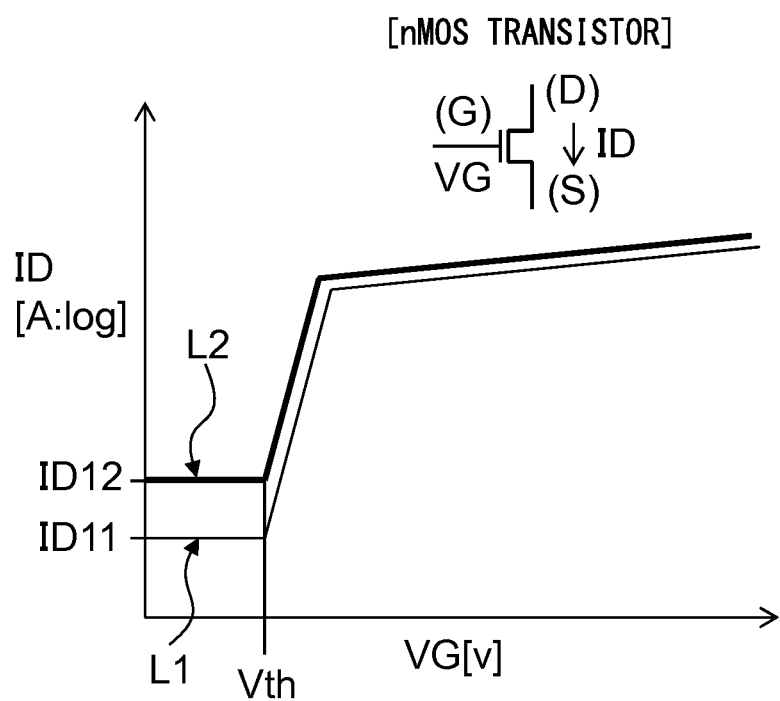
FIG. 1 is a diagram describing transistor characteristics associated with miniaturization in semiconductor manufacturing processes.

FIG. 1 is a diagram to describe transistor characteristics associated with miniaturization in semiconductor manufacturing processes, illustrating a drain current ID [A] with respect to a gate voltage (gate-source voltage) VG [V] of an n-channel type MOS (nMOS) transistor in a logarithmic expression (log).

In FIG. 1, a reference symbol L1 refers to characteristics of an nMOS transistor manufactured by an old process and L2 refers to characteristics of an nMOS transistor manufactured by a new process in which miniaturization has advanced further than the old process.

As clearly illustrated in the comparison between the characteristics L2 and characteristics L1, in a region where the gate voltage VG is lower than or equal to a threshold voltage Vth, for example, it is found that a drain current ID12 by the new semiconductor manufacturing process is much larger than a drain current ID11 by the old semiconductor manufacturing process.

In other words, when miniaturization in the semiconductor manufacturing process advances, channel length of a transistor shortens, causing an increase in an off-state current, i.e., an increase in a leakage current, through the transistor.

Figure 2:
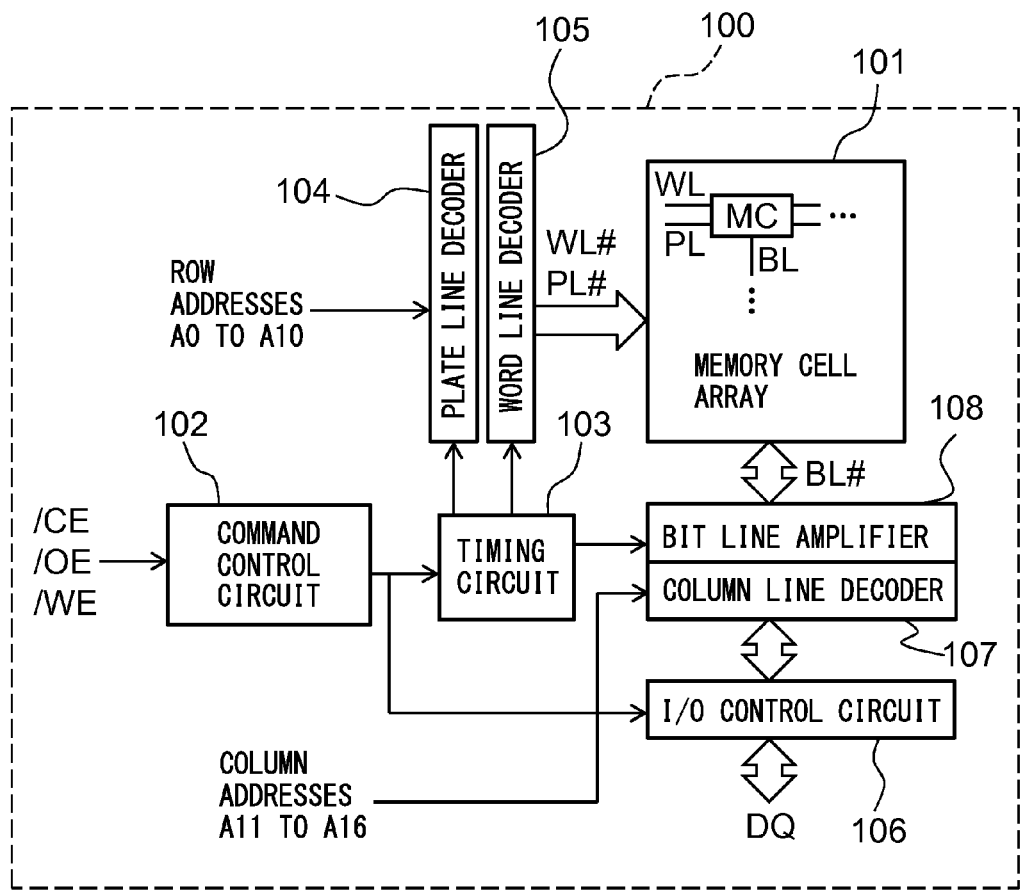
FIG. 2 is a block diagram illustrating an overall configuration of an example of a semiconductor memory device.

FIG. 2 is a block diagram illustrating an overall configuration of an example of the semiconductor memory device, illustrating an overall configuration of an FeRAM (ferroelectric memory: Ferroelectric Random Access Memory: FRAM (a registered trademark)).

An FeRAM is a nonvolatile semiconductor memory device in which positive and negative spontaneous polarization is associated with data "1" and "0", respectively, by using hysteresis of a ferroelectric. Although an FeRAM is described as an example of a semiconductor memory device in this disclosure, applications of this embodiment described later are not limited to FeRAMs.

As illustrated in FIG. 2, the FeRAM 100 includes a memory cell array 101, command control circuit 102, timing circuit 103, plate line decoder 104, word line decoder 105, I/O control circuit 106, column line decoder 107, and bit line amplifier 108.

The memory cell array 101 includes, for example, a plurality of memory cells MC arranged in a matrix, each of which is individually connected to a word line WL, bit line BL, and plate line PL. The memory cell MC is, for example, a 1T1C-type ferroelectric memory cell, which contains a transistor and a capacitor.

The command control circuit 102 receives commands such as, for example, a chip enable signal /CE, output enable signal /OE, and write enable signal /WE and controls the timing circuit 103 and I/O (input and output) control circuit 106.

In other words, by setting the chip enable signal /CE and output enable signal /OE to a low level "L", a data read operation from a selected memory cell MC is carried out. Moreover, by setting the chip enable signal /CE and write enable signal /WE to a high level "H" from "L", a data write operation to a selected memory cell MC is carried out.

The timing circuit 103, in response to a read command or write command, generates a timing to raise (Charge) or lower (Pre-charge) the potentials of a selected word line WL and plate line PL. The timing circuit 103 also generates timing for a circuit in the bit line amplifier 108 to carry out amplification.

Reference symbols A0 to A16 refer to address signals input from the outside and a predetermined memory cell MC in the memory cell array 101 in the FeRAM 100 is accessed by these address signals A0 to A16.

The address signals A0 to A16 are divided into row address signals A0 to A10, which are input to the plate line decoder 104 and word line decoder 105, and column address signals A11 to A16, which are input to the column line decoder (bit line decoder) 107.

The plate line decoder 104 and word line decoder 105 control selection of plate lines PL# and word lines WL# by the row address signals A0 to A10. The column line decoder 107 controls selection of bit lines BL# by the column address signals A11 to A16.

Specifically, in the example in FIG. 2, by the row address signals A0 to A10, a plate line PL and word line WL are selected out of 2048 plate lines PL and word lines WL, respectively, via the plate line decoder 104 and word line decoder 105.

Further, by the column address signals A11 to A16, a bit line amplifier (108) is selected out of 64 bit line amplifiers (108), via the column line decoder 107. In the example in FIG. 2, the memory cell array 101 includes $2^{17}$ (128 k bits) memory cells MC, out of which a predetermined memory cell for one bit is selected.

The bit line amplifier 108 is a circuit to amplify a signal on a bit line BL connected to the memory cell MC. A reference symbol DQ refers to a data signal read out from the memory cell array 101 and a data signal written to the memory cell array 101.

In other words, the I/O control circuit 106, according to an output signal from the command control circuit 102, carries out control to write data (DQ), which are input from the outside, to a predetermined memory cell MC in the memory cell array 101 or to output data (DQ), which are read out from a predetermined memory cell, to the outside.

Figure 3:
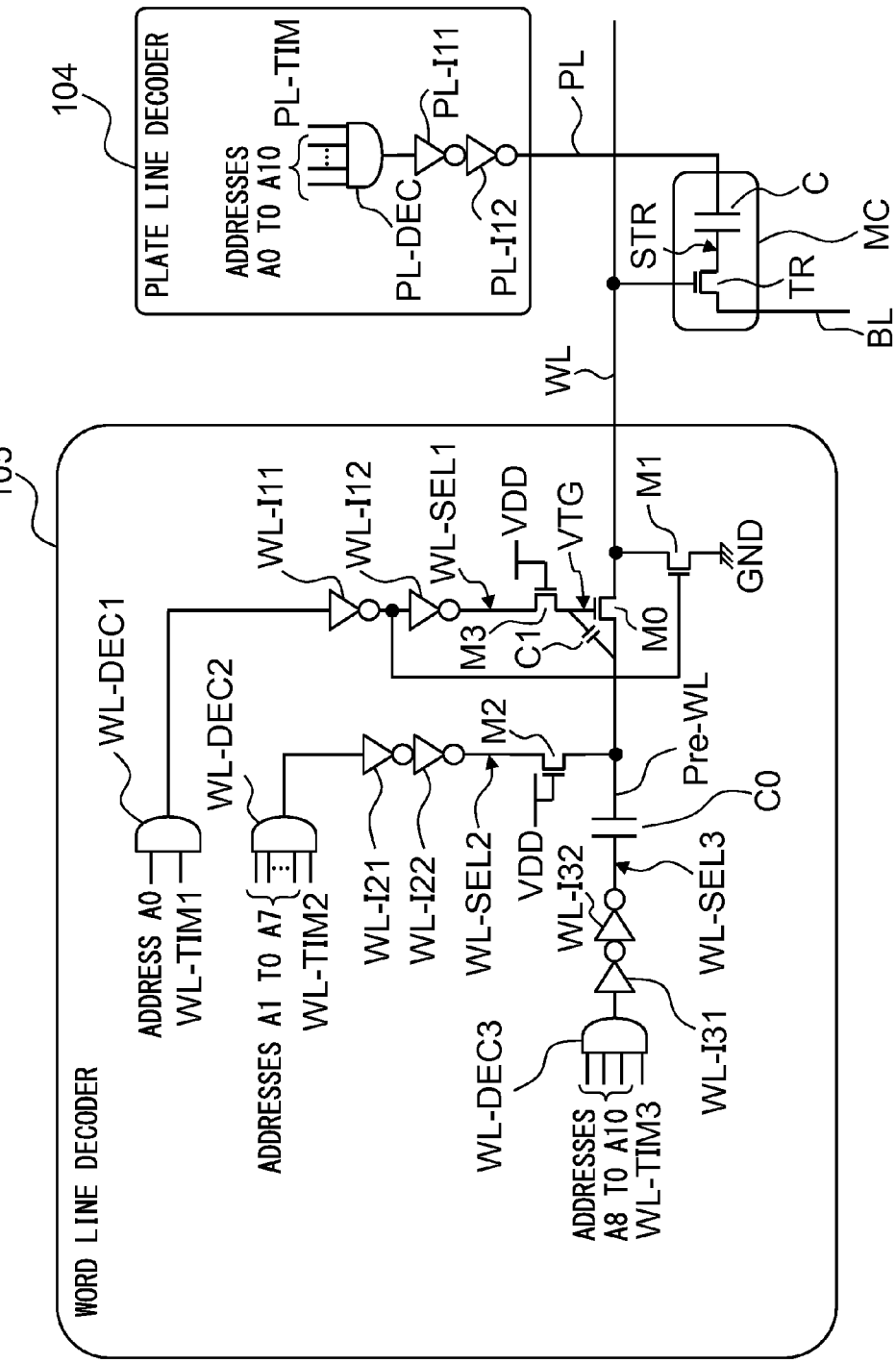
FIG. 3 is a circuit diagram illustrating a portion of the semiconductor memory device illustrated in FIG. 2.

FIG. 3 is a circuit diagram illustrating a portion of the semiconductor memory device illustrated in FIG. 2, and illustrates the plate line decoder 104, word line decoder 105, and memory cell MC of the FeRAM in FIG. 2. Although, in FIG.

3, the transistors M0 to M3 and TR are illustrated as nMOS transistors, the configuration is not limited to an nMOS transistor.

As illustrated in FIG. 3, the memory cell MC is formed as an FeRAM cell which contains a transistor TR and ferroelectric capacitor C. One end of the capacitor C is connected to the plate line PL and the other end of the capacitor C is connected to the source of the transistor TR. The gate of the transistor TR is connected to the word line WL and the drain of the transistor TR is connected to the bit line BL.

Writing of data "1" and "0" to the memory cell MC is carried out by, for example, applying a potential difference of +VDD or –VDD to both terminals of the ferroelectric capacitor C.

In this disclosure, when data "1" is written to the memory cell MC, for example, the bit line BL is set to a power supply potential (VDD) and the plate line PL is set to a ground potential (GND: e.g. 0 V). When data "0" is written to the memory cell MC, for example, the bit line BL is set to GND and the plate line PL is set to VDD.

Data after writing are maintained even after the selected word line WL transitions to a non-selected state (i.e., the transistor TR is turned off) and becomes non-volatile data. In other words, data "1" and "0" are maintained by remanence on the ferroelectric capacitor C after applied voltage thereto is taken away.

The plate line decoder 104 includes a decoder circuit PL-DEC, which receives the address signals (row addresses) A0 to A10 and a control signal PL-TIM from the timing circuit 103, and two-staged inverters PL-I11 and PL-I12 installed at the output of the decoder circuit PL-DEC. The output of the decoder circuit PL-DEC is input to one end of the capacitor C in the memory cell MC as a plate signal on the plate line PL via the two-staged inverters PL-I11 and PL-I12.

The word line decoder 105 includes three decoder circuits WL-DEC1, WL-DEC2, and WL-DEC3, which receive address signals and control signals from the timing circuit 103, respectively. The decoder circuit WL-DEC1 receives the address signal A0 and a control signal WL-TIM1. The output of the decoder circuit WL-DEC1 is input to the drain of a transistor M3 via two-staged inverters WL-I11 and WL-I12.

To the gate of the transistor M3, a power supply voltage VDD is applied and the source of the transistor M3 is connected to the gate of a transistor (transfer gate transistor to the word line WL) M0. Between the gate and source (i.e., between the source of the transistor M3 and a pre-word line Pre-WL) of the transistor M0, parasitic capacitance C1 exists. A reference symbol VTG refers to a gate voltage of the transistor M0.

The output of the decoder circuit WL-DEC1 is inverted by the inverter WL-I11 and also input to the gate of a pull-down transistor M1. The source of the transistor M1 is grounded (GND) and the drain of the transistor M1 is connected to the word line WL.

The decoder circuit WL-DEC2 receives the address signals A1 to A7 and a control signal WL-TIM2. The output of the decoder circuit WL-DEC2 is, via two-staged inverters WL-I21 and WL-I22, input to the drain of a transistor M2. To the gate of the transistor M2, VDD is applied and the source of the transistor M2 is connected to the pre-word line Pre-WL.

The decoder circuit WL-DEC3 receives the address signals A8 to A10 and a control signal WL-TIM3. The output of the decoder circuit WL-DEC3 is, via two-staged inverters WL-I31 and WL-I32, input to one end of a capacitor C0. The other end of the capacitor C0 is connected to the source of the transistor M2 and the source of the transistor M0, i.e., the pre-word line Pre-WL.

The outputs of the decoder circuits WL-DEC1, WL-DEC2, and WL-DEC3 are, via the two-staged inverter pairs WL-I11 and WL-I12, WL-I21 and WL-I22, and WL-I31 and WL-I32, output as selection signals WL-SEL1, WL-SEL2, and WL-SEL3, respectively.

Although, in FIG. 3, the plate line decoder 104 and word line decoder 105 connected to a memory cell MC are illustrated, in an actual circuit, for example, a plurality of similar circuits are installed for a plurality of memory cells MC arranged in a matrix.

As described above, the plate line decoder 104 and word line decoder 105 respectively input and decode control signals from the timing circuit 103 and address signals and select a memory cell MC connected to a predetermined word line WL and plate line PL.

The three decoder circuits WL-DEC1, WL-DEC2, and WL-DEC3 in the word line decoder 105 input and decode control signals from the timing circuit 103 and address signals and select a predetermined word line WL. In other words, the word line decoder 105 selects a corresponding word line WL based on read commands or write commands input to the timing circuit 103.

As described above, the word line WL is connected to the gate of the transistor (cell transistor) TR in the memory cell MC and, when a read operation is carried out, selecting the plate line PL makes the capacitance of the capacitor C in the memory cell MC transmitted to the bit line BL.

In this operation, because a voltage at the interconnection node of the transistor TR and capacitor C (storage voltage STR) is lower than a generally-used power supply voltage VDD, the voltage is transmitted to the bit line BL sufficiently even when the voltage of the word line WL (gate voltage of the transistor TR) is equal to VDD.

When a write operation is carried out, the plate line PL is in the non-selected state (ground potential GND) and the bit line BL rises to VDD when data "1" is written. When data "0" is written, the bit line BL falls to the ground potential (GND).

When data "1" is written, although the word line WL is in the selected state, the gate voltage of the transistor TR is boosted higher than VDD by, for example, the threshold voltage Vth or more in order to transmit a potential of VDD on the bit line BL as the storage voltage STR.

Accordingly, the three decoder circuits WL-DEC1, WL-DEC2, and WL-DEC3 in the word line decoder 105 generate a boosted voltage, which is used when data "1" is written, on the word line WL (at the gate of the transistor TR). Such boosted voltage is not limited to an FeRAM but is also used in other various semiconductor memory devices, including a DRAM.

Figure 4:
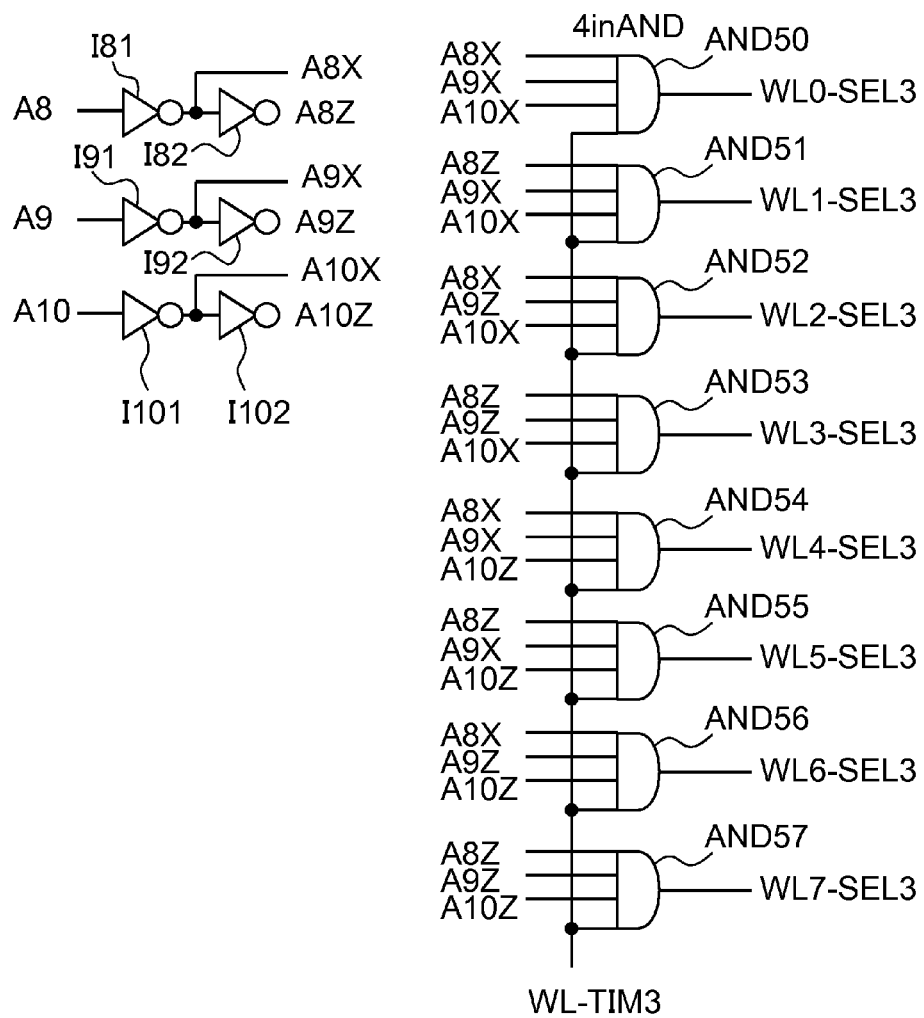
FIG. 4 is a circuit diagram illustrating a portion of a word line decoder illustrated in FIG. 3.

FIG. 4 is a circuit diagram illustrating a portion of the word line decoder illustrated in FIG. 3 and illustrates an example of the decoder circuit WL-DEC3 which receives the address signals A8 to A10 and the control signal WL-TIM3 from the timing circuit 103 and generates selection signals WL-SEL3 (WL0-SEL3 to WL7-SEL3).

As illustrated in FIG. 4, the decoder circuit WL-DEC3 includes two-staged inverter pairs I81 and I82, I91 and I92, and I101 and I102, which receive the address signals A8 to A10, respectively, and eight 4-input NAND gates NAND50 to NAND57, which receive an output from each inverter and the control signal WL-TIM3.

Outputs A8X, A9X, and A10X of the first stage inverters I81, I91, and I101 are logical inversion signals of the address signals A8 to A10 and the outputs A8Z, A9Z, and A10Z of the second stage inverters I82, I92, and I102 are signals of the same logic as the address signal A8 to A10.

To each of the NAND gates NAND50 to NAND57, logical inversion and non-inversion signals of the address signals A8 to A10 and the control signal WL-TIM3 are input. When the control signal WL-TIM3 is "H", the selection signals WL0-SEL3 to WL7-SEL3 corresponding to the address signals are output.

In other words, the selection signals WL-SEL3 (WL0-SEL3 to WL7-SEL3) are generated based on the address signals A8 to A10 and the control signal WL-TIM3 from the timing circuit 103. The other word line decoders WL-DEC1 and WL-DEC2 and the plate line decoder PL-DEC have similar configurations to the configuration of the word line decoder WL-DEC3 illustrated in FIG. 4 although there are differences in the number of bits and the control signals.

Figure 5A:
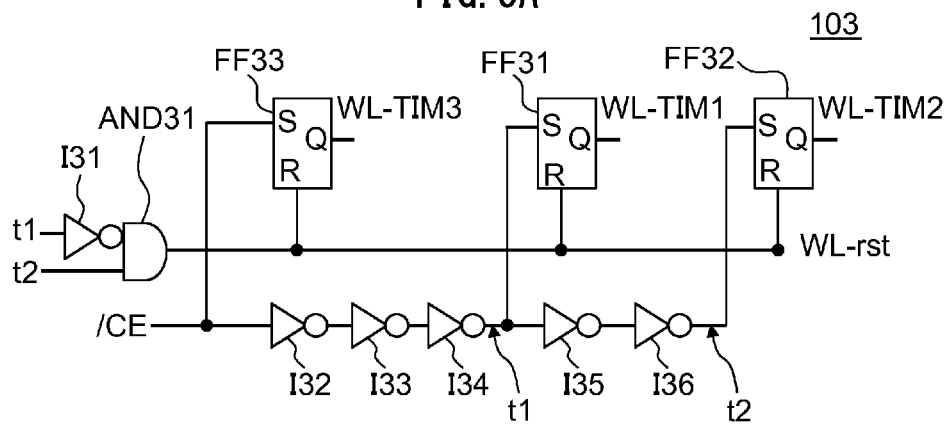
FIG. 5A is a circuit diagram illustrating a configuration example of a timing circuit in the semiconductor memory device illustrated in FIG. 2.
Figure 5B:
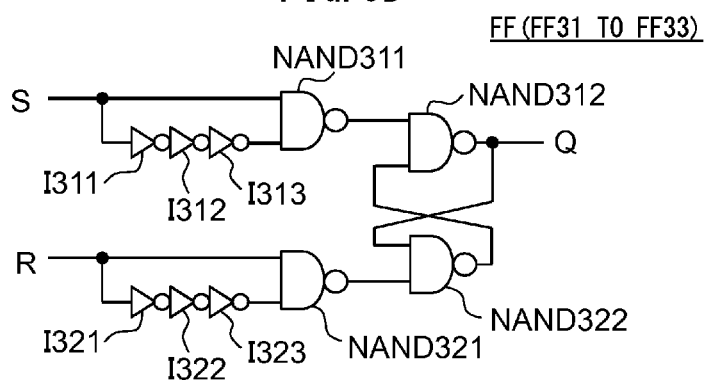
FIG. 5B is a circuit diagram illustrating an example of a flip-flop in the timing circuit illustrated in FIG. 5A.
Figure 5C:
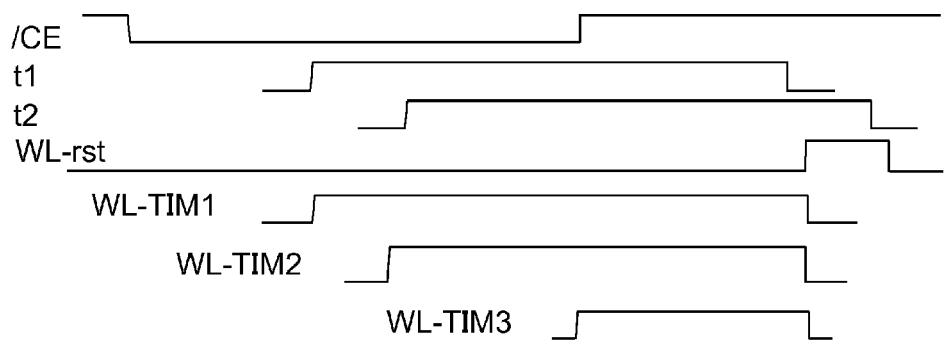
FIG. 5C is a waveform chart describing an operation of the timing circuit illustrated in FIG. 5A.

FIGS. 5A to 5C are diagrams to describe an example of the timing circuit in the semiconductor memory device illustrated in FIG. 2. FIG. 5A is a circuit diagram illustrating a configuration example of the timing circuit 103 in the semiconductor memory device illustrated in FIG. 2. FIG. 5B is a circuit diagram illustrating an example of a flip-flop FF in the timing circuit 103 illustrated in FIG. 5A. FIG. 5C is a waveform chart to describe an operation of the timing circuit 103 illustrated in FIG. 5A.

As illustrated in FIG. 5A, the timing circuit 103 includes SR flip-flops FF31 to FF33, an AND gate AND31, and inverters I31 to I36 and, to the first stage inverter I32 of the cascaded inverters I32 to I36, the chip enable signal /CE is input.

To one input of the AND gate AND31, a signal t1, which is logically inverted by the inverters, is input, and, to the other input of the AND gate AND31, a signal t2 is input. The signal t1 is an output signal of the inverter I34, and the signal t2 is an output signal of the last stage inverter I36.

To the set terminal (S) of the flip-flop FF33, the chip enable signal /CE is input as it is, to the set terminal of the flip-flop FF31, the signal t1 is input, and, to the set terminal of the flip-flop FF32, the signal t2 is input. To the reset terminal (R) of each of the flip-flops FF31 to FF33, an output signal (a reset signal of the word line WL) WL-rst of the AND gate AND31 is input.

As illustrated in FIG. 5B, each of the flip-flops FF (FF31 to FF33) includes NAND gates NAND311, NAND312, NAND321, and NAND322 and inverters I311 to I313 and I321 to I323.

The NAND gates NAND312 and NAND322 form a latch, in which an input of one NAND gate and the output of the other NAND gate are cross-connected. To the other input of the NAND gate NAND312, the output signal of the NAND gate NAND311 is input, and, to the other input of the NAND gate NAND322, the output signal of the NAND gate NAND321 is input.

The cascaded inverters, i.e., the inverters I32 to I36, I311 to I313, and I321 to I323 are used to provide a delay time and have a structure such that, by, for example, lengthening the channel length of a transistor or the like, the driving capability of the transistor is decreased.

The set terminal of the flip-flop FF is connected to one input of the NAND gate NAND311 and is also connected to the input of the first stage inverter I311 of the odd-number-staged (three stages in FIG. 5B) inverters I311 to I313. To the other input of the NAND gate NAND311, the output of the last stage inverter I313 of the inverters I311 to I313 is connected.

Similarly, the reset terminal of the flip-flop FF is connected to one input of the NAND gate NAND321 and is also connected to the input of the first stage inverter I321 of the odd-number-staged (three stages) inverters I321 to I323. To the other input of the NAND gate NAND321, the output of the last stage inverter I323 of the inverters I321 to I323 is connected.

With the above configuration, as illustrated in FIG. 5C, after the chip enable signal /CE is activated and falls from "H" to "L", the signal t1 and signal t2 sequentially rise from "L" to "H" at delayed timings.

Then, the SR flip-flops FF31 to FF33 output the signals (control signals) WL-TIM1, WL-TIM2, and WL-TIM3 that sequentially rise from "L" to "H", respectively. All of these signals WL-TIM1, WL-TIM2, and WL-TIM3 are reset by falling from "H" to "L" when the word line reset signal (output signal of the AND gate AND31) WL-rst changes from "L" to "H".

Figure 6:
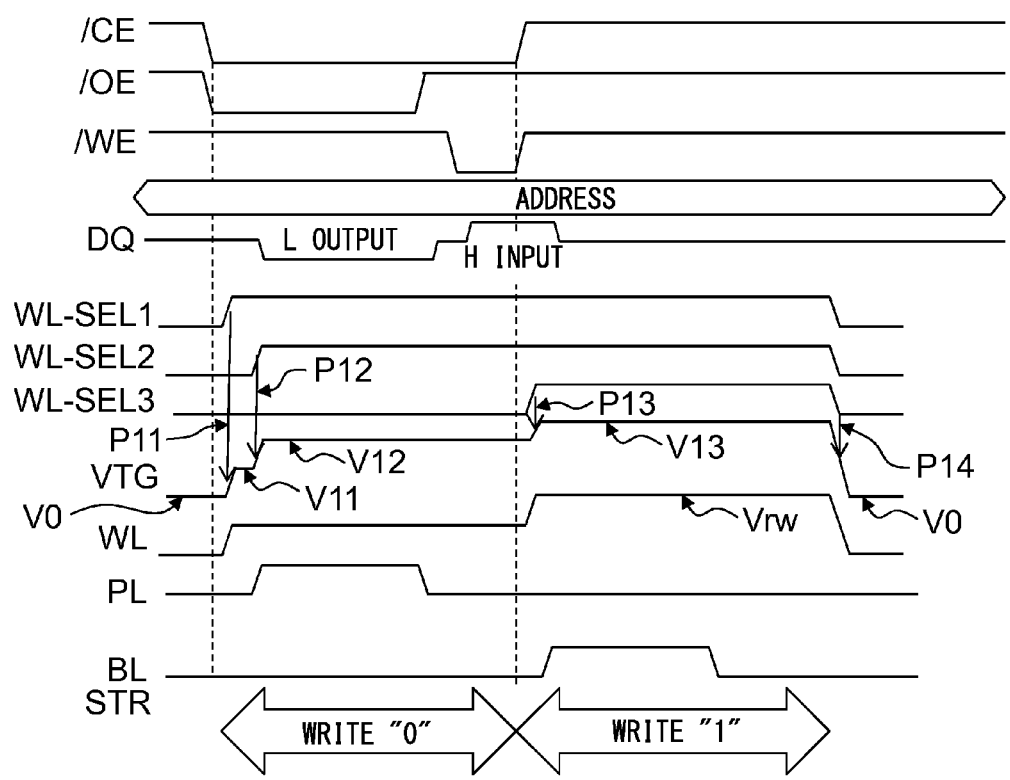
FIG. 6 is a waveform chart describing an operation of an example of the semiconductor memory device.

FIG. 6 is a waveform chart to describe an operation of an example of the semiconductor memory device and to describe an example of an operation of the FeRAM (ferroelectric memory). In the example illustrated in FIG. 6, data "0" is written to all memory cells MC first, and then, data "1" is written to predetermined memory cells MC to which data "1" has to be written.

In other words, as illustrated in FIG. 6, by changing the chip enable signal /CE from the high level "H" to the low level "L" (/CE=L) first, the semiconductor memory device (FeRAM) starts the operation. At the same time, a read command is generated by changing the output enable signal /OE from "H" to "L", and with this command, data from the capacitor C in the memory cell MC (storage voltage STR) are read out. Then, by changing the write enable signal /WE from "H" to "L", a write command is recognized.

Next, by using a rising edge from "L" to "H" of the write enable signal /WE, data DQ are fetched, and, by using a rising edge from "L" to "H" of the chip enable signal /CE, a write operation is started.

When data are read, the word line WL is raised to the power supply potential (VDD). At this timing, the selection signals WL-SEL1 and WL-SEL2 are sequentially raised from "L" to "H" (refer to P11 and P12 in FIG. 6).

In other words, as described with reference to FIG. 3, when the selection signal WL-SEL1 is raised from "L" to "H", the gate voltage VTG of the transfer gate transistor M0 on the word line WL is boosted from V0 to V11 (P11) via the transistor M3. Although the gate of the transistor M0 has a potential lower than VDD because the gate of the transistor M3 has a potential of VDD, the transistor M0 turns on.

Next, when the selection signal WL-SEL2 is raised from "L" to "H", the level of the pre-word line Pre-WL rises via the transistor M2.

At this time, because the parasitic capacitance C1 exists between the gate of the transistor M0 and the pre-word line Pre-WL (the source of the transistor M0), the gate voltage VTG of the transistor M0 is boosted further from V11 to V12 by electrical charges coupled to the parasitic capacitance C1 (P12).

In other words, the gate voltage VTG of the transistor M0 becomes higher than VDD, making it possible that the transistor M0 transmits the voltage of the pre-word line Pre-WL to the word line WL.

Finally, the selection signal WL-SEL3 is raised from "L" to "H" (refer to P13 in FIG. 6). The output of the inverter WL-I32, from which the selection signal WL-SEL3 is output, is connected to the pre-word line Pre-WL via a capacitor C0. With this configuration, electrical charges stored in the capacitor C0 are transferred to the pre-word line Pre-WL, causing the potential on the pre-word line Pre-WL to be much higher than VDD.

The potential of this pre-word line Pre-WL also reaches the parasitic capacitance C1, the gate voltage VTG of the transistor M0 is boosted from V12 to a much higher V13 (P13), and a potential higher than VDD on the pre-word line Pre-WL is transmitted to the word line WL via the transistor M0. With this configuration, it becomes possible to boost the level of the word line WL to a voltage Vrw, which is sufficiently higher than VDD (higher than or equal to the threshold voltage Vth of the transistor TR).

Because electrical charges flow out to the power supply side when the gate voltage VTG of the transistor M0 becomes higher than the threshold voltage (Vth) of the transistor M3, the gate voltage VTG of the transistor M0 does not become higher than the threshold voltage of the transistor M3.

As described above with reference to FIG. 5C, when, for example, all control signals (WL-TIM1, WL-TIM2, and WL-TIM3), which change according to the word line reset signal (WL-rst), fall from "H" to "L", all the selection signals WL-SEL1 to WL-SEL3 also fall from "H" to "L" (P14). With this change, the gate voltage VTG of the transistor M0 returns to the original V0.

Figure 7:
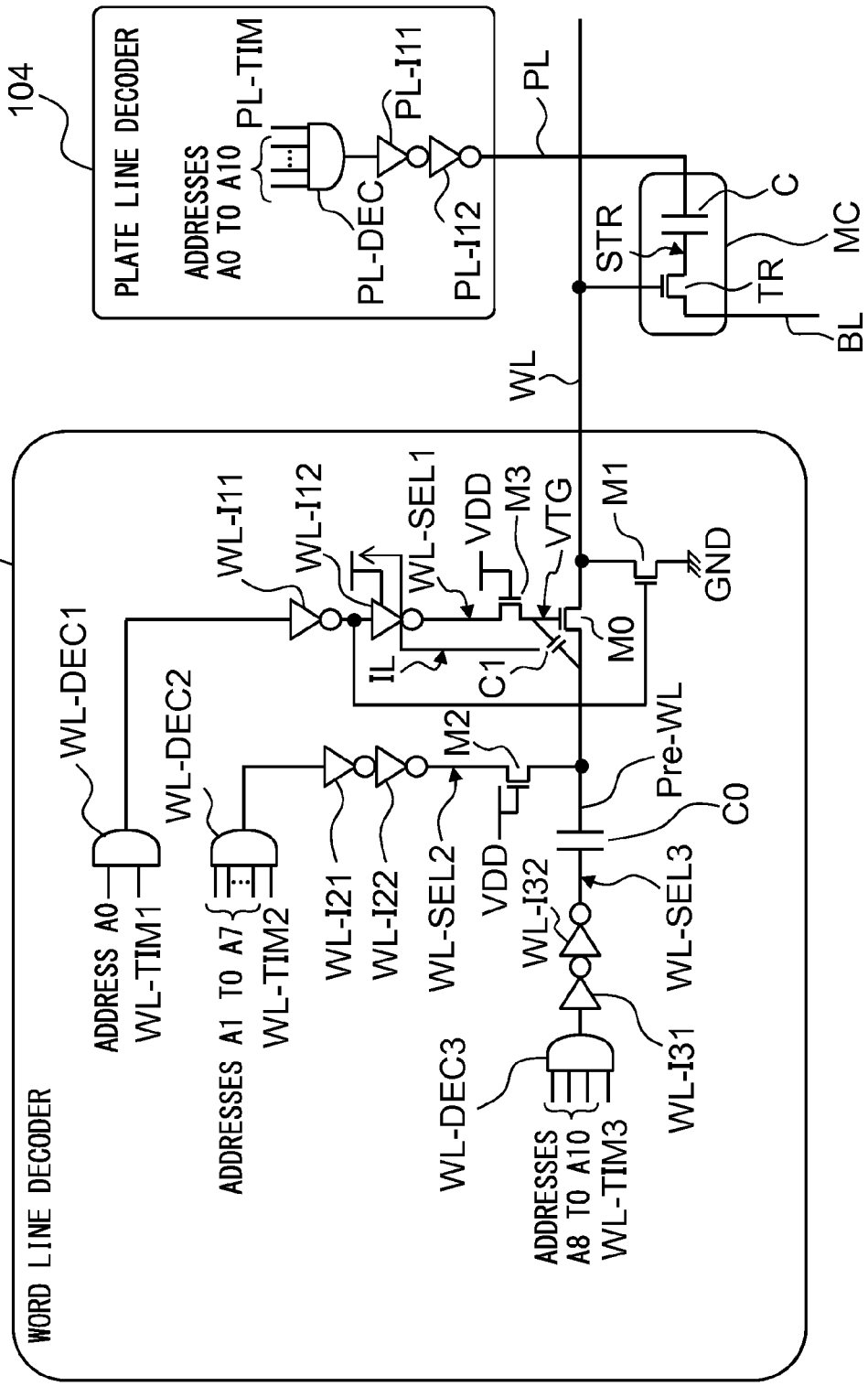
FIG. 7 is a diagram describing a problem in a portion of the semiconductor memory device illustrated in FIG. 3.

FIG. 7 is a diagram to describe a problem in a portion of the semiconductor memory device illustrated in FIG. 3 and illustrates a similar configuration to the configuration in FIG. 3. As described above, as miniaturization in the semiconductor manufacturing process advances, channel length of a transistor, for example, becomes short, causing an off-state current of the transistor to increase.

In other words, even when a transistor is in the off-state with the gate voltage of the transistor being lower than or equal to the threshold voltage (Vth) of the transistor, a considerable amount of off-state current (a current between the source and the drain) flows.

In particular, when a current between the source and drain (leakage current) IL of the transistor M3 in FIG. 7 increases, electrical charges coupled to the capacitor (parasitic capacitance) C1 flow out to the power supply side of the inverter WL-I12, causing the gate voltage VTG of the transistor M0 to decrease. This phenomenon takes place when, for example, an interval between a read command and a succeeding write command is long (e.g. on the order of several hundred nsec to several μsec).

Specifically, for example, a case in which a system includes a first memory chip and a second memory chip, an access to the second memory chip is carried out after a read command is output to the first memory chip, and then a write command to the first memory chip is output corresponds to the above condition.

Alternatively, for example, a case in which it takes approximately several μsec for a CPU to output a read command to a memory (FeRAM), to accesses other peripheral circuits, and to output a write command to the memory also corresponds to the above condition. These cases may take place on a commonly-used system frequently.

Figure 8:
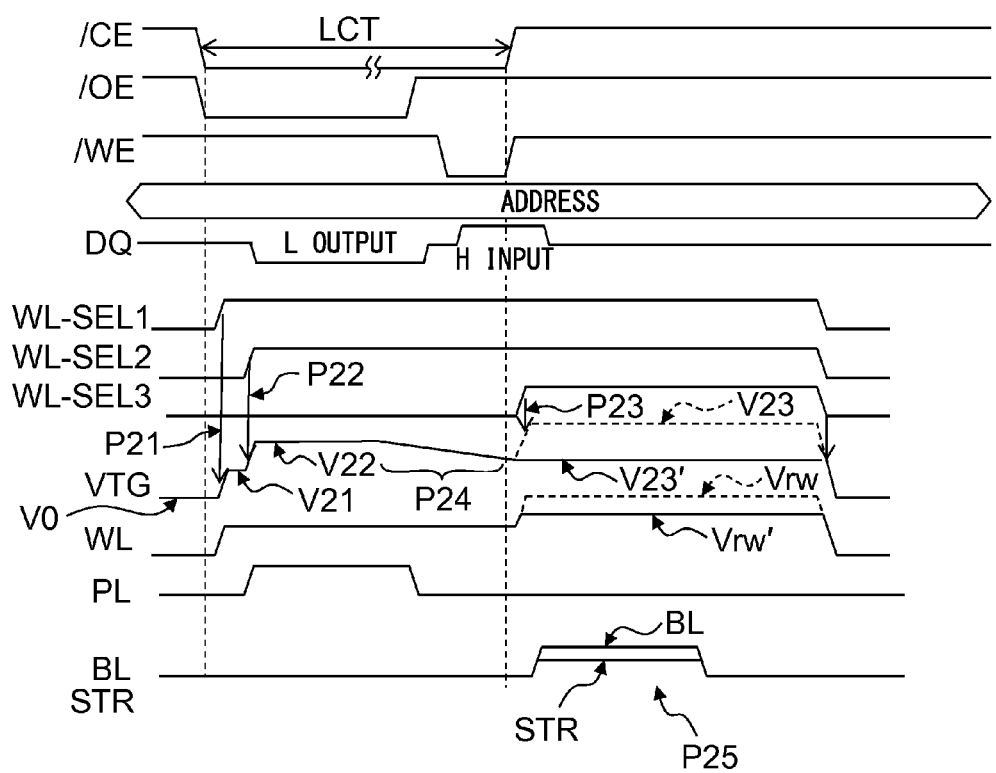
FIG. 8 is a waveform chart describing an operation of the semiconductor memory device when the problem described with reference to FIG. 7 takes place.

FIG. 8 is a waveform chart to describe an operation of the semiconductor memory device when the problem described with reference to FIG. 7 takes place and illustrates, for example, a case in which the gate voltage VTG of the transistor M0 decreases due to a leakage current IL through the transistor M3. In other words, FIG. 8 illustrates each signal waveform for a case in which, for example, a write command is output when a long cycle time LCT has passed after a read command is output.

As illustrated in FIG. 8, when the chip enable signal /CE and output enable signal /OE is lowered from "H" to "L", the selection signals WL-SEL1 and WL-SEL2 sequentially rise from "L" to "H". With this operation, the gate voltage VTG of the transfer gate transistor M0 is boosted from V0 to V21 to V22 in incremental steps (refer to P21 and P22 in FIG. 8). This operation is similar to the operation described above with reference to FIG. 6.

However, when this state holds long (long cycle time LCT), due to, for example, a leakage current IL through the transistor M3, the gate voltage VTG of the transistor M0, as illustrated, for example, by P24 in FIG. 8, decreases from V22 to V23' gradually.

Therefore, as illustrated by P23 in FIG. 8, even when the selection signal WL-SEL3 is raised from "L" to "H", it is difficult to boost the gate voltage VTG of the transistor M0 up to a sufficient voltage V23 to turn on the transistor M0.

Furthermore, it also becomes difficult to boost the level of the word line WL up to the sufficient voltage Vrw to turn on and write data "1" to the transistor TR in the memory cell MC. In other words, the potential of the word line WL may be boosted up to Vrw' and it becomes difficult, for example, to turn on and write data "1" to the transistor TR in the memory cell MC.

If writing to the memory cell MC is insufficient, i.e., the ferroelectric capacitor C is not sufficiently polarized, a predetermined amount of electrical charges does not come out on the bit line BL, causing, for example, a reading failure.

Figure 9:
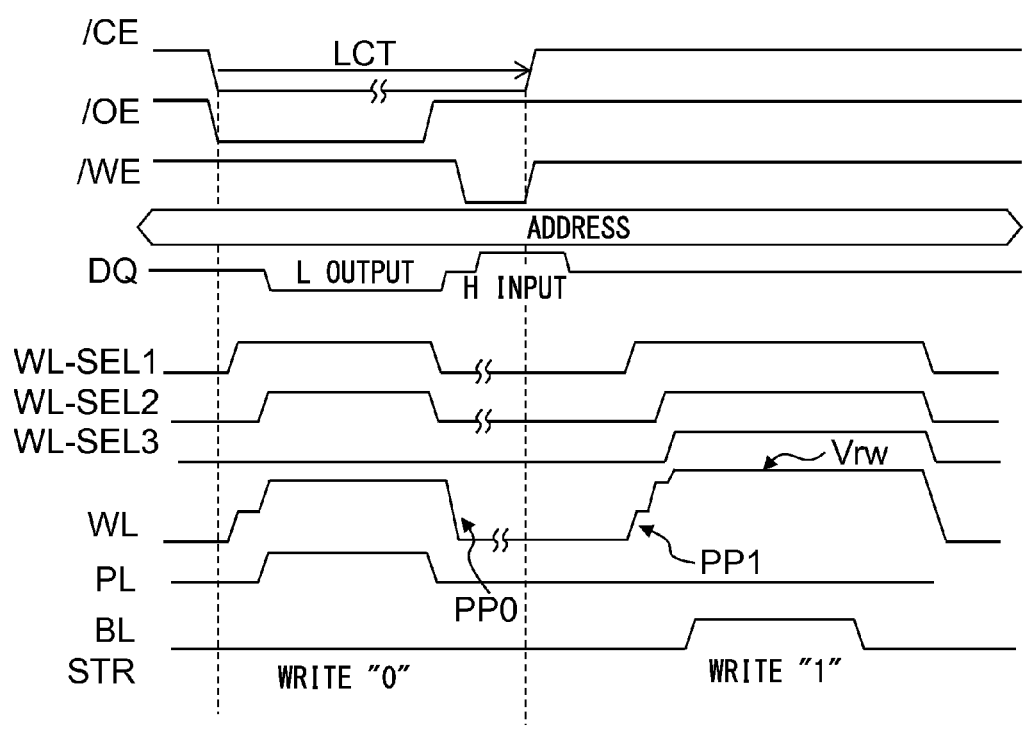
FIG. 9 is a diagram describing a method to solve the problem described with reference to FIGS. 7 and 8.

FIG. 9 is a diagram to describe a solution method for the problem described above with reference to FIGS. 7 and 8. As illustrated in FIG. 9, a possible solution to the problem described above with reference to FIGS. 7 and 8 is, for example, that the word line WL is pre-charged (the level of the word line WL is lowered) at the same time as a read operation ends.

As illustrated by PP0 in FIG. 9, when reading ends, the word line WL is lowered to the pre-charge level. Then, as illustrated by PP1 in FIG. 9, when the next writing starts, by raising the word line WL again, the effect of the leakage current IL through the transistor M3 is lessened.

In other words, before the potential of the gate voltage VGT of the transistor M0 decreases due to a leakage current IL through the transistor M3, boost processing of the word line WL is ended once. By starting boost processing of the word line WL again when the next write command is output, the level of the word line WL is raised to the sufficient voltage Vrw to turn on and write data "1" to the transistor TR in the memory cell MC and, then, write processing is carried out.

Figure 10A:
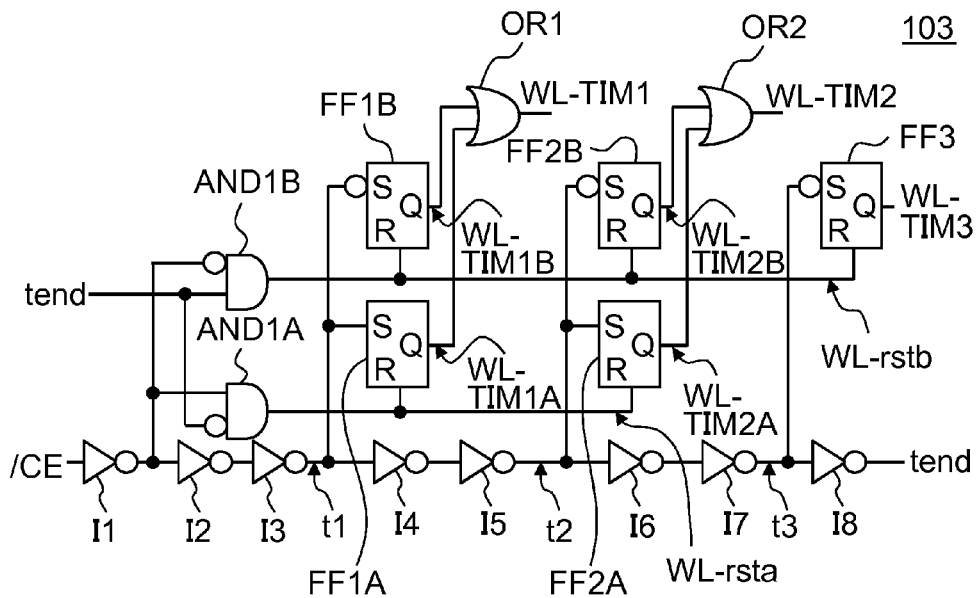
FIG. 10A is a diagram describing an example of the semiconductor memory device which carries out the solution method of the problem described with reference to FIG. 9 and a circuit diagram illustrating a configuration example of the timing circuit.
Figure 10B:
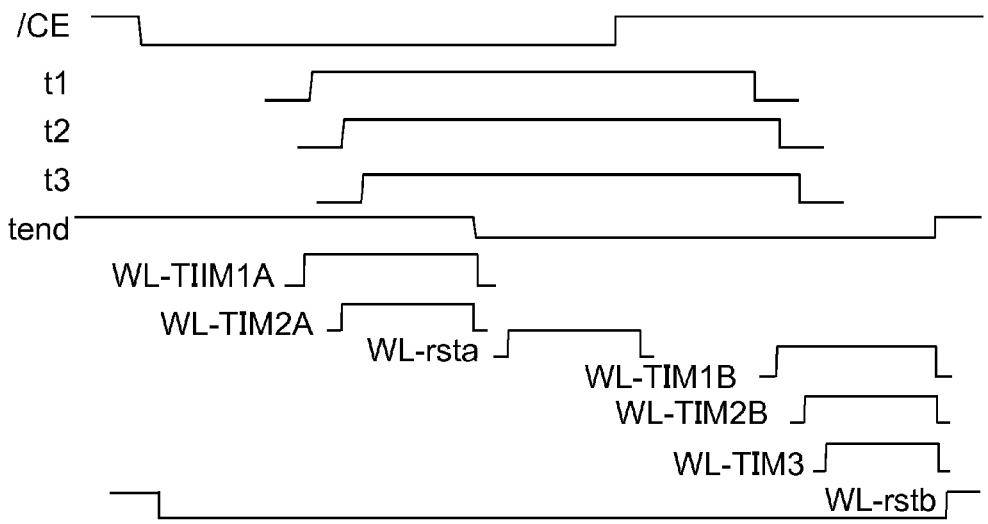
FIG. 10B is a waveform chart describing an operation of the timing circuit illustrated in FIG. 10A.

FIGS. 10A and 10B are diagrams to describe an example of the semiconductor memory device which implements the solution method of the problem described above with reference to FIG. 9. FIG. 10A is a circuit diagram illustrating a configuration example of the timing circuit 103 and FIG. 10B is a waveform chart to describe an operation of the timing circuit 103 illustrated in FIG. 10A.

As illustrated in FIG. 10A, the timing circuit 103 includes SR flip-flops FF1A, FF1B, FF2A, FF2B, and FF3, AND gates AND1A and AND1B, OR gates OR1 and OR2, and inverters I1 to I8.

To the first stage inverter I1 of the cascaded inverters I1 to I8, the chip enable signal /CE is input. In FIG. 10A, to the inputs of logical inversion of the AND gates AND1A and AND1B and flip-flops FF1B, FF2B, and FF3, circle marks are added.

To one input of the AND gate AND1A and one inverted input of the AND gate AND1B, an output signal of the inverter I1 is input, and to the other inverted input of the AND gate AND1A and the other input of the AND gate AND1B, an end signal (delay signal) tend is input. The end signal tend is an output signal of the last stage inverter I8 and a signal which is generated by delaying the chip enable signal /CE and has the same logic as the chip enable signal.

The output signal of the inverter I1, which is provided to one inverted input of the AND gate AND1B, may, for example, be logically inverted by an inverter and provided to a non-inverted input (positive logic input) of the AND gate AND1B. Alternatively, the chip enable signal /CE may be provided to the non-inverted input of the AND gate AND1B. It is needless to say, however, that logic of a signal, logic gates, and so on may be altered appropriately.

To the set terminal (S) of the flip-flop FF1A and the inverted set terminal of the flip-flop FF1B, an output signal t1 of the inverter I3 is input, and, to the set terminal of the flip-flop FF2A and the inverted set terminal of the flip-flop FF2B, an output signal t2 of the inverter I5 is input. Moreover, to the inverted set terminal of the flip-flop FF3, an output signal t3 of the inverter I7 is input.

An output signal WL-rsta of the AND gate AND1A is input to the reset terminals (R) of the flip-flops FF1A and FF2A, and an output signal WL-rstb of the AND gate AND1B is input to the reset terminals of the flip-flops FF1B, FF2B, and FF3.

The outputs (Q) of the flip-flops FF1A and FF1B are input to the OR gate OR1 which takes a logical sum of them and the logical sum is output as a control signal WL-TIM1. The outputs of flip-flops FF2A and FF2B are input to the OR gate OR2 which takes a logical sum of them and the logical sum is output as a control signal WL-TIM2. Moreover, the output of the flip-flop FF3 is output as it is as a control signal WL-TIM3.

The control signals WL-TIM1, WL-TIM2, and WL-TIM3 from the timing circuit 103 are, as described above with reference to, for example, FIG. 3, input to the decoder circuits WL-DEC1, WL-DEC2, and WL-DEC3 in the word line decoder 105.

As described above, even when an interval between an output of a read command and an output of a write command is long, it becomes possible to boost the level of the word line WL up to the sufficient voltage Vrw to turn on the transistor TR of the memory cell MC.

However, the method, which is described above with reference to FIGS. 9, 10A, and 10B, has a new problem that, because the word line WL is once lowered to the pre-charge level and is raised again, consumption current increases.

Consumption current Icc is, in general, computed as Icc=I$_0$×f, where I$_0$ is a current per cycle of a circuit (FeRAM) and f is an operating frequency. In other words, the higher a frequency is, the greater current is consumed, and, the lower the frequency is, the fewer current is consumed.

In addition, the above-described insufficient writing to a memory cell MC due to a leakage current IL is, for example, a phenomenon that takes place when it takes a long cycle time LCT, a case in which a cycle time is long because a system carries out other processing (which corresponds to a case in which an operating frequency is low).

In contrast, in an operation at a high frequency in which consumption current increases, i.e. a regular operation in which a cycle time is short, a write operation ends before an insufficient writing to the memory cell MC due to a leakage current IL takes place.

The semiconductor memory device of the embodiment will be described in detail below referring to the accompanying drawings. The semiconductor memory device of the embodiment is, for example, applied to the semiconductor memory device (FeRAM) with reference to the above-described FIGS. 1 to 11. Application of the embodiment is, however, not limited to an FeRAM (ferroelectric memory) but may be carried out for various semiconductor memory devices, including a DRAM, as described above.

Figure 11:
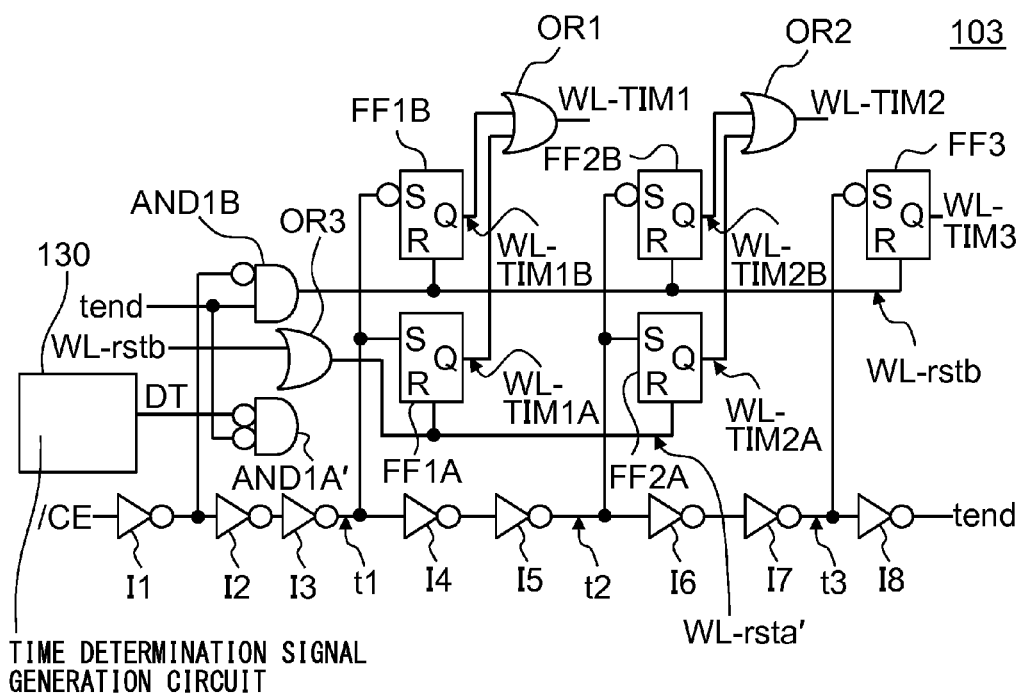
FIG. 11 is a circuit diagram illustrating a main portion of the semiconductor memory device according to the embodiment.

FIG. 11 is a circuit diagram illustrating a main portion of the semiconductor memory device according to the embodiment, and, specifically, illustrates a configuration of the timing circuit 103. As illustrated in FIG. 11, in the timing circuit of the embodiment, the AND gate AND1A in FIG. 10A is replaced with an AND gate AND1A', which receives a time determination signal DT by one inverted input, and moreover, a time determination signal generation circuit 130 and an OR gate OR3 are added.

Both of two inputs of the AND gate AND1A' are inverted inputs. To one inverted input of the AND gate AND1A', the time determination signal DT, which is the output of the time determination signal generation circuit 130, is input. To the other inverted input of the AND gate AND1A', an end signal tend is input.

An output signal of the AND gate AND1A' is not input directly to the reset terminals (R) of the flip-flops FF1A and FF2A but is input to the other input of the new OR gate OR3, to one input of which the output of the AND gate AND1B (reset signal) WL-rstb is input.

The output of the OR gate OR3 is input to the reset terminals of the flip-flops FF1A and FF2A as a reset signal WL-rsta'.

The time determination signal DT is a signal to determine whether or not a low operating frequency makes a cycle time lengthen (becomes to take a long cycle time LCT) and insufficient writing to a memory cell MC due to the above-described leakage current IL takes place.

Other configurations and signals are similar to the configuration and signals in FIG. 10A and hence will not be described. The time determination signal generation circuit 130 may be installed outside the timing circuit 103. To the memory cell MC, for example, a 1T1C-type ferroelectric memory cell, which contains a transistor and a capacitor, may be applied.

Figure 12:
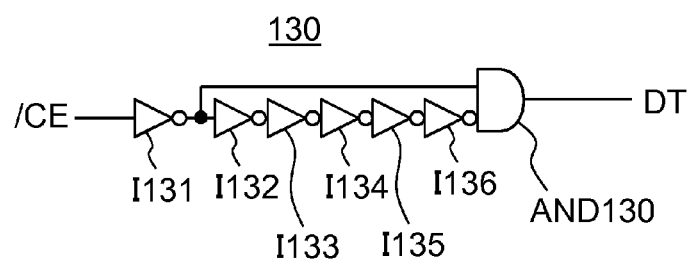
FIG. 12 is a circuit diagram illustrating an example of a time determination signal generation circuit.

FIG. 12 is a circuit diagram illustrating an example of the time determination signal generation circuit. As illustrated in FIG. 12, the time determination signal generation circuit 130, which generates the time determination signal DT, is, for example, installed in the timing circuit 103 and includes a plurality of inverters I131 to I136 and an AND gate AND130.

The inverters I131 to I136 are cascaded, the chip enable signal /CE (command) is input to the input of the first stage inverter I131, and the AND gate AND130 receives and takes a logical product of the output of the first stage inverter I131 and the output of the last stage inverter I136.

With this configuration, it is possible to generate the time determination signal DT that holds "H" for a predetermined determination time. The number of stages of inverters, logic of a signal and so on may be altered appropriately, and, in addition, a delay time may be controlled by, in substitution for an inverter, changing channel length of a transistor, wiring width, and so on.

Furthermore, commands to be compared with a predetermined determination time by the time determination signal DT, for example, are not limited to the chip enable signal /CE but various commands may be used. It is needless to say that the time determination signal DT, logic of the commands (e.g. "DT=H" and "/CE=L"), logic gates of timing circuits, and so on may be changed in various way.

Figure 13A:
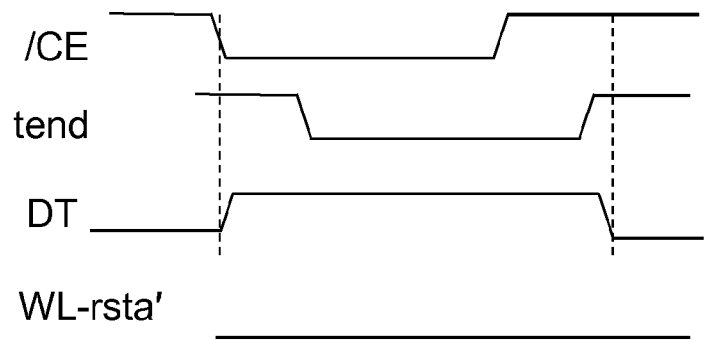
FIG. 13A is a simplified waveform chart for a case in which the time determination signal generation circuit illustrated in FIG. 12 is applied (a case in which a cycle time is shorter than a predetermined determination time)
Figure 13B:
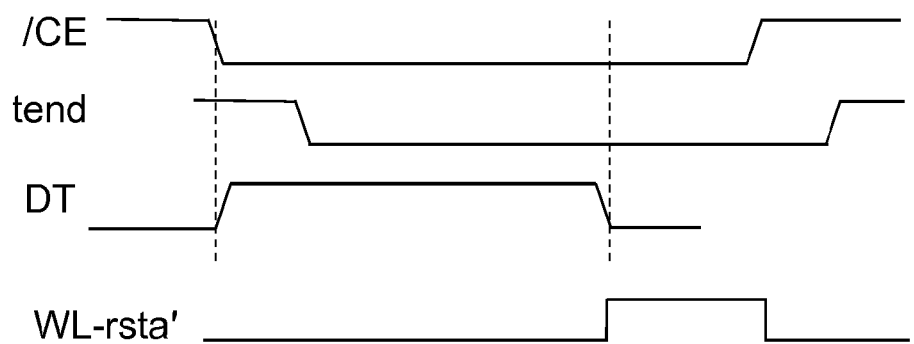
FIG. 13B is a simplified waveform chart for a case in which the time determination signal generation circuit illustrated in FIG. 12 is applied (a case in which a cycle time is longer than a predetermined determination time)

FIG. 13A is a simplified waveform chart for a case in which the time determination signal generation circuit illustrated in FIG. 12 is applied (a case in which a cycle time is shorter than a predetermined determination time). FIG. 13B is a simplified waveform chart for a case in which the time determination signal generation circuit illustrated in FIG. 12 is applied (a case in which a cycle time is longer than a predetermined determination time).

As illustrated in FIG. 13A, when a cycle time is shorter than a predetermined determination time, i.e., a period for which the chip enable signal /CE is set to a low level "L" is shorter than a period for which the time determination signal DT is set to a high level "H", the processing described above with reference to FIG. 6 is carried out as it is.

In this processing, because a period when /CE="L" (an enable time) is shorter than a period when DT="H" (a predetermined determination time), the output of the OR gate OR3 (reset signal WL-rsta') is maintained at "L" and thus the flip-flops FF1A and FF2A are not reset. In other words, as will be described in detail with reference to FIGS. 15 and 16, the circuit in this case is similar to the circuit in FIG. 5A and the processing in FIG. 6 is carried out.

On the other hand, when a cycle time is longer than a predetermined determination time as illustrated in FIG. 13B, i.e., a period for which /CE is set to the low level "L" is longer than a period for which DT is set to the high level "H", the processing described above with reference to FIG. 9 is carried out.

In this processing, because a period when /CE="L" is longer than a period when DT="H", a pulse of the high level "H" is generated to the output of the OR gate OR3 (WL-rsta') at the timing of the time determination signal DT falling from "H" to "L".

With this configuration, the flip-flops FF1A and FF2A are reset, the outputs Q of the flip-flops FF1A and FF2A (WL-TIM1A and WL-TIM2A) fall from "H" to "L", the circuit becomes similar to the circuit in FIG. 10A, and the processing in FIG. 9 is carried out. Details will be described later with reference to FIGS. 17 and 18.

As described above, according to the embodiment, whether or not processing to solve insufficient writing to a memory cell caused by a leakage current is carried out is decided by determining whether or not it takes a long cycle time (LCT) by the time determination signal DT.

In other words, it is possible to carry out a sufficient write operation while suppressing an increase in consumption current by not carrying out a pre-charge of the word line WL when a period in which /CE="L" is shorter than a period in which DT="H" and carrying out a pre-charge of the word line WL when a period in which /CE="L" is longer than a period in which DT="H".

If a time determination signal DT is generated by the time determination signal generation circuit 130 described above with reference to FIG. 12, the predetermined determination time is determined without any relation to the leakage current IL through the transistor M3 described above with reference to FIG. 7. For example, when the leakage current IL is large, there is a possibility that the potential of the gate voltage VTG of the transfer gate transistor M0 has decreased.

Specifically, a leakage current through a transistor increases as temperature increases, and a delay time of an inverter increases (becomes longer) as temperature increases. In other words, as temperature increases, a period for which the time determination signal DT is set to a high level "H" ("DT=H") lengthens, which makes it difficult to decide that it takes a long cycle time LCT.

Figure 14:
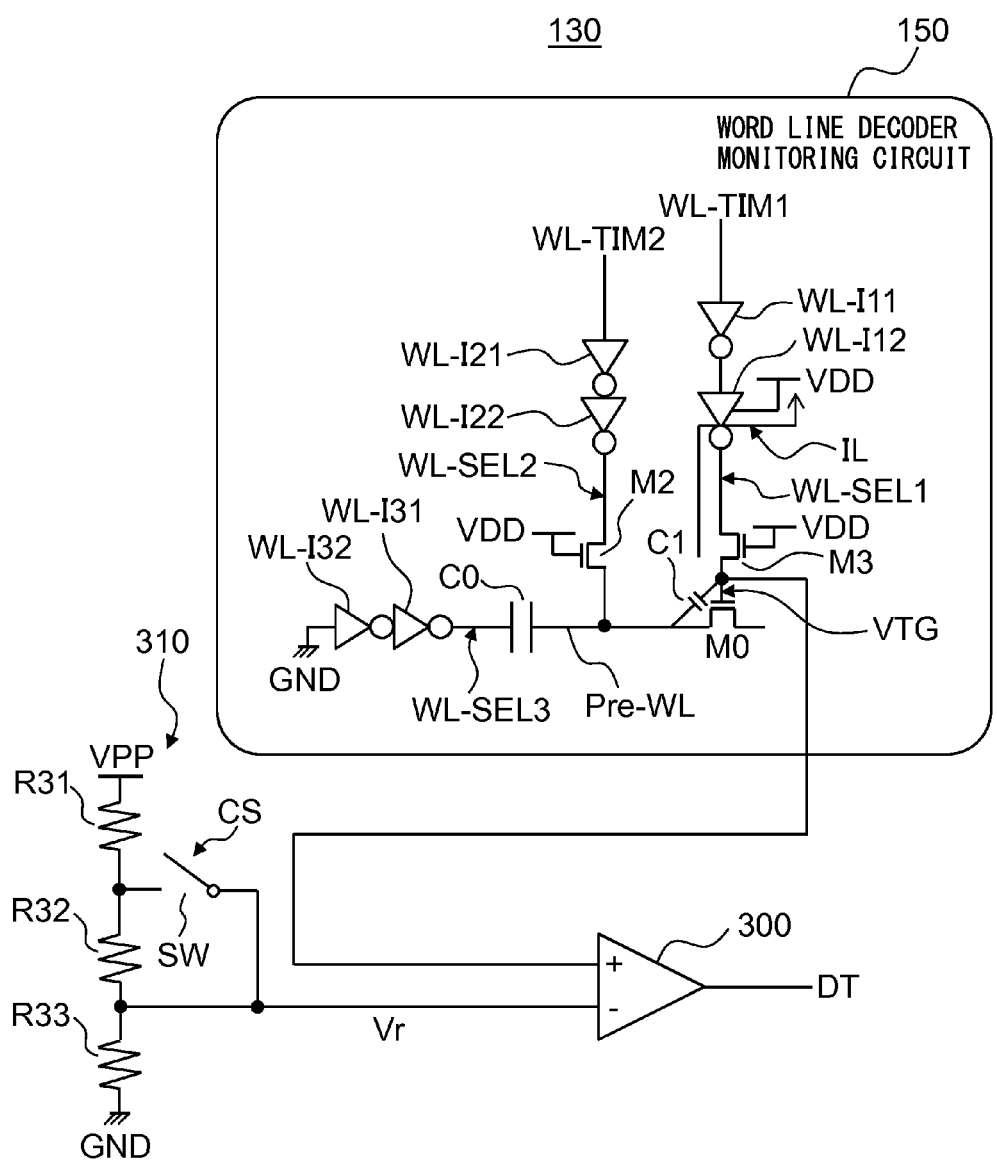
FIG. 14 is a circuit diagram illustrating another example of the time determination signal generation circuit.

FIG. 14 is a circuit diagram illustrating another example of the time determination signal generation circuit and illustrates an example of the time determination signal generation circuit 130 that generates a time determination signal DT by, for example, taking into consideration a change in the leakage current IL due to the temperature in an environment where the FeRAM is used or the like.

As illustrated in FIG. 14, the time determination signal generation circuit 130 includes a word line decoder monitoring circuit 150, in which transistors, similar to transistors in an actual word line decoder (e.g. the word line decoder 105 illustrated in FIG. 3), are used, a differential amplifier 300 and a reference voltage generation unit 310.

The word line decoder monitoring circuit 150 is installed because there is a possibility that the potential of the gate voltage VTG of the transfer gate transistor M0 in the word line decoder 105 has decreased.

As apparent from a comparison between FIGS. 14 and 3, in the word line decoder monitoring circuit 150 in FIG. 14, the decoder circuits WL-DEC1, WL-DEC2, and WL-DEC3 are not included. This is because it is sufficient for the word line decoder monitoring circuit 150 to monitor a boost circuit potion (boost function) of the actual word line decoder 105.

In other words, to the inputs of the inverters WL-I11 and WL-I21, the control signals WL-TIM1 and WL-TIM2 are directly input, respectively, and the input of the inverter WL-I31 is grounded (GND).

In the time determination signal generation circuit 130 illustrated in FIG. 14, the gate voltage VTG of the transfer gate transistor M0 in the word line decoder monitoring circuit 150 is input to the first input of the differential amplifier 300 as it is and is compared (differential amplification) with a reference voltage Vr of the second input.

The reference voltage generation unit 310 includes resistors R31 to R33 connected in series between a boosted voltage line (VPP) and ground line (GND) and a switch SW which is controlled by a control signal CS. The switch SW switches the voltage at the connection node of the resistors R31 and R32 and the voltage at the connection node of the resistors R32 and R33 and outputs either of the voltages to the differential amplifier 300 as the reference voltage Vr.

In other words, by controlling the switch SW by the switch control signal CS, the potential of the reference voltage Vr, which is compared with the gate voltage VTG of the transistor M0 input to the differential amplifier 300 from the word line decoder monitoring circuit 150, is adjusted. This configuration makes it possible to carry out an adjustment to the predetermined determination time of the time determination signal DT (a period when DT="H").

The reference voltage generation unit 310 which generates the reference voltage Vr may be implemented with various circuits and may generate a fixed voltage corresponding to a gate voltage VTG that makes the transistor M0 turn on without any failure.

In the time determination signal generation circuit described above with reference to FIG. 12, for example, the time determination signal DT (a period when DT="H") tends to lengthen at a high temperature, under which the leakage current IL is large, because the time determination signal DT is generated by using a delay circuit configured with the inverters I131 to I136. This is because nMOS transistors in a delay circuit configured with inverters have the property that, at high temperatures, an on-state current decreases and a delay time lengthens.

On the other hand, in the time determination signal generation circuit illustrated in FIG. 14, when the leakage current IL increases at high temperatures, the potential of the gate voltage VTG of the transfer gate transistor M0 decreases faster, causing the time determination signal DT (a period when DT="H") to shorten.

As described above, by applying the time determination signal generation circuit illustrated in FIG. 14, it becomes possible to carry out a proper operation by, for example, compensating an effect of a change in a leakage current IL due to temperatures or the like in an environment in which the FeRAM is used.

Figure 15:
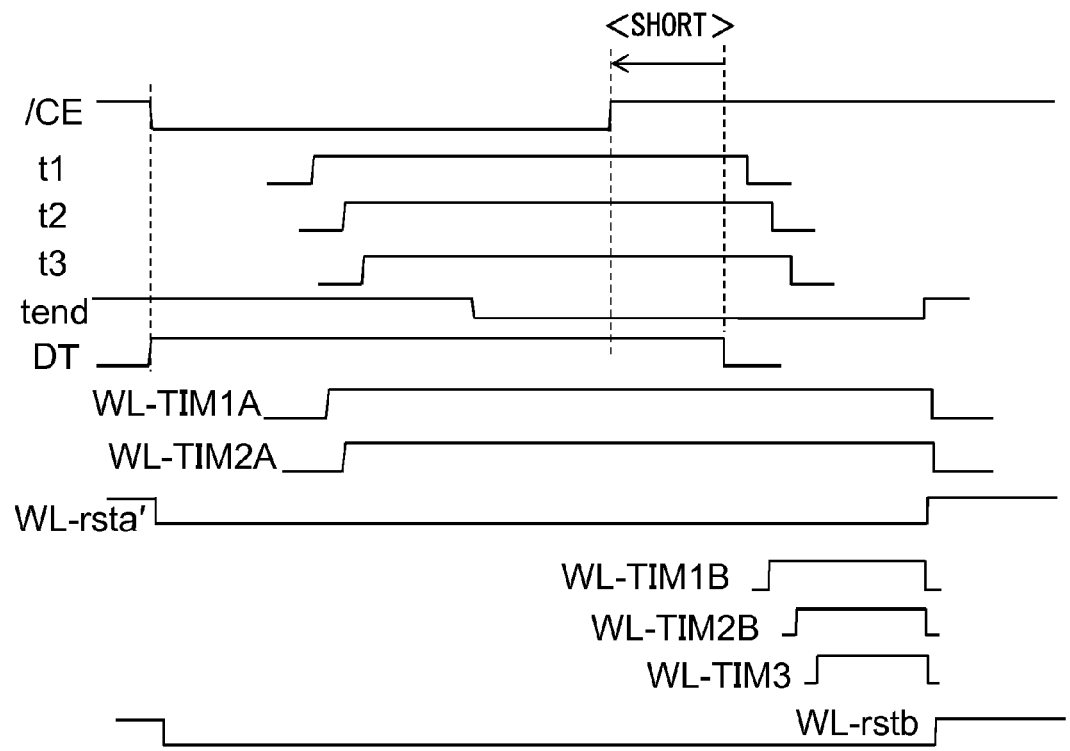
FIG. 15 is a waveform chart describing an operation of the semiconductor memory device for a case in which a cycle time is shorter than a predetermined determination time.

FIG. 15 is a waveform chart to describe an operation of the semiconductor memory device when a cycle time is shorter than a predetermined determination time.

Figure 16:
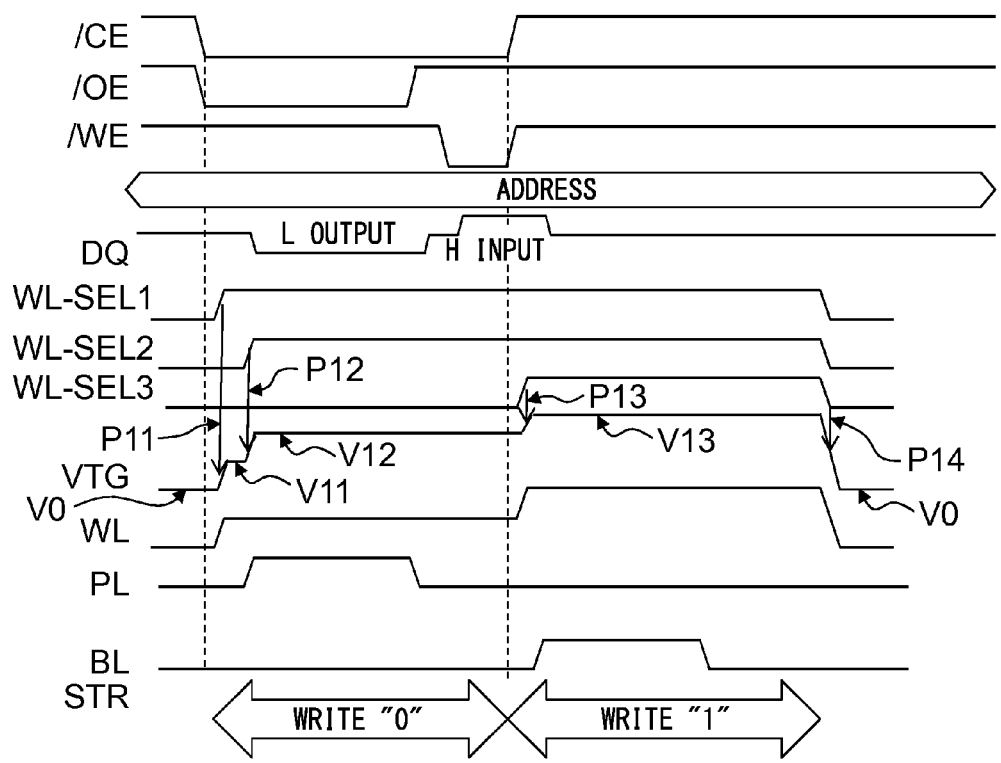
FIG. 16 is a waveform chart describing an operation of the semiconductor memory device for the case illustrated in FIG. 15.

FIG. 16 is a waveform chart to describe an operation of the semiconductor memory device for the case illustrated in FIG. 15.

Figure 17:
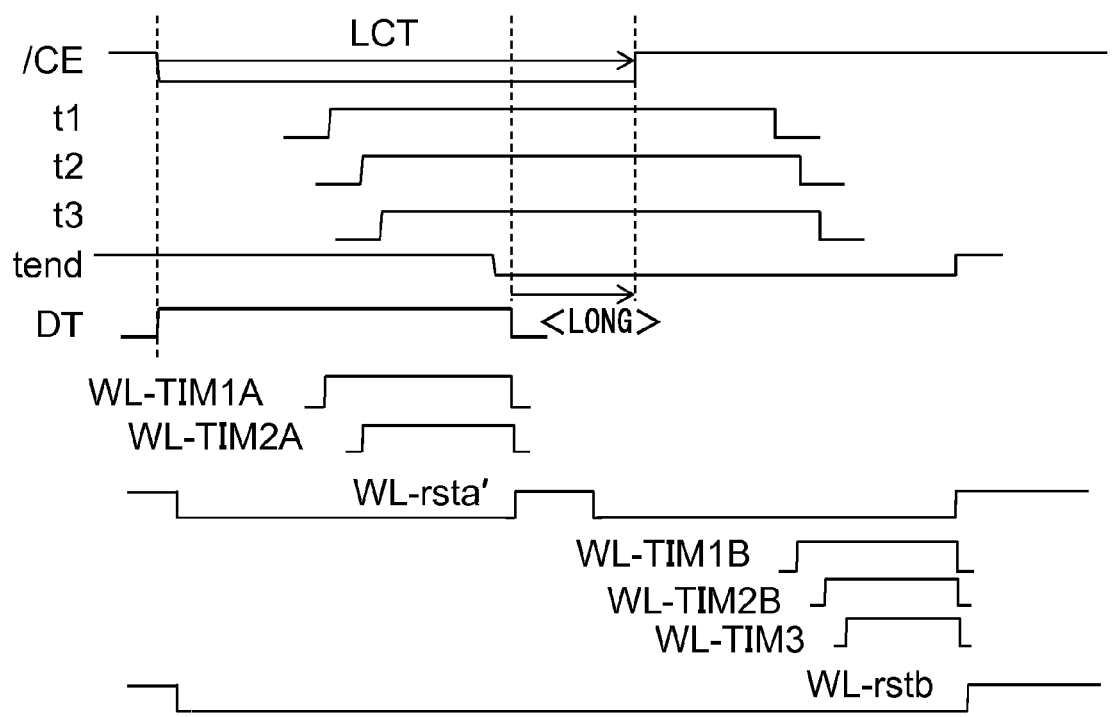
FIG. 17 is a waveform chart describing an operation of the semiconductor memory device for a case in which a cycle time is longer than a predetermined determination time.

FIG. 17 is a waveform chart to describe an operation of the semiconductor memory device when a cycle time is longer than a predetermined determination time.

Figure 18:
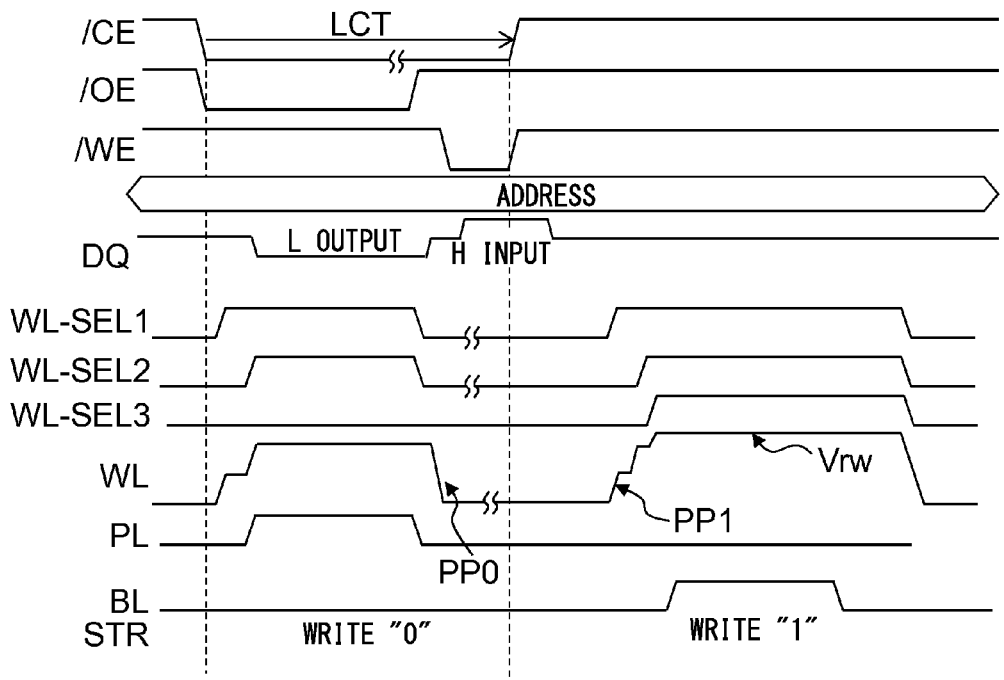
FIG. 18 is a waveform chart describing an operation of the semiconductor memory device for the case illustrated in FIG. 17.

FIG. 18 is a waveform chart to describe an operation of the semiconductor memory device for the case illustrated in FIG. 17.

Although a period when DT="H" in FIG. 15 is drawn longer than a period when DT="H" in FIG. 17 and a period when /CE="L" is drawn in the same length in both FIGS. 15 and 17, it is sufficient to consider a comparison of length between a period when /CE="L" and a period when DT="H".

For example, the same processing is carried out for both cases in which a time determination signal DT with a fixed period when DT="H" is generated by the circuit illustrated in FIG. 12 and in which a time determination signal DT with a varying period when DT="H" due to, for example, the temperature or the like in an environment around the circuit is generated by the circuit illustrated in FIG. 14.

In other words, when a period when /CE="L" is shorter than a period when DT="H", the processing in FIGS. 15 and 16 is carried out, and when a period when /CE="L" is longer than a period when DT="H", the processing in FIGS. 17 and 18 is carried out.

First, as illustrated in FIG. 15, when a cycle time is shorter than a predetermined determination time, i.e. a period when /CE="L" is shorter than a period when DT="H", the processing described above with reference to FIG. 6 is carried out as it is.

In this processing, because, in the circuit illustrated in FIG. 11, the output of the AND gate AND1A' is set to "L" in a period when DT="H" and, in the period, the reset signal WL-rstb is set to "L", the output of the OR gate OR3 (reset signal WL-rsta') is maintained at "L". Therefore, the outputs of the flip-flops FF1B and FF2B become the outputs of the OR gates OR1 and OR2 (control signals WL-TIM1 and WL-TIM2 from the timing circuit 103) as they are.

The AND gate AND1B in FIG. 11 practically corresponds to the AND gate AND31 in FIG. 5A, and the timing circuit illustrated in FIG. 11 corresponds to the timing circuit illustrated in FIG. 5A.

Accordingly, when a period when /CE="L" is shorter than a period when DT="H", before insufficient writing to the memory cell MC caused by a leakage current IL takes place, it is decided that a write operation is ending, a next write command is awaited without any action and then write processing is carried out. In other words, the waveform chart illustrated in FIG. 16 is similar to the waveform chart illustrated in the above-described FIG. 6 and the processing described above with reference to FIG. 6 is carried out as it is.

Next, when the cycle time is longer than a predetermined determination time as illustrated in FIG. 17, i.e., a period when /CE="L" is longer than a period when DT="H", it is decided that it takes a long cycle time LCT.

Under this condition, in the circuit illustrated in FIG. 11, when the time determination signal DT falls from "H" to "L", the output of the AND gate AND1A' rises from "L" to "H", and the reset signal WL-rsta' output from the OR gate OR3 rises to "H".

As apparent from a comparison between FIGS. 11 and 17 and the above-described FIGS. 10A and 10B, the reset signal WL-rsta' in FIG. 17 corresponds to the reset signal WL-rsta in FIG. 10B.

Accordingly, when a period when /CE="L" is longer than a period when DT="H", it is decided that insufficient writing to the memory cell MC caused by a leakage current IL is taking place and processing similar to the processing in the above-described FIGS. 9, 10A, and 10B is carried out. In other words, the waveform chart illustrated in FIG. 18 is similar to the waveform chart illustrated in the above-described FIG. 9 and the processing described above with reference to FIG. 9 is carried out as it is.

As described above, according to the embodiment, by deciding whether or not processing to resolve insufficient writing to a memory cell due to a leakage current is carried out based on a determination whether or not it takes a long cycle time, it becomes possible that proper data writing is carried out while an increase in consumption current is suppressed.

A period for which the time determination signal DT satisfies DT="H" (predetermined determination time) is determined, for example, as described in detail with reference to FIGS. 7 and 8, based on a time for which a decrease in the gate voltage VTG of the transistor M0 due to the leakage current IL through the transistor M3 becomes a problem.

Specifically, for example, when a problem takes place when an interval between a read command and a succeeding write command is 1 μsec, the determination time (a period for which DT="H" is satisfied) may be set to approximately 500 nsec by leaving a margin.

The determination time, as described above, may be set to, for example, a value which changes dynamically according to a condition such as the temperature at which the FeRAM, to which the embodiment is applied, is used. The determination time, however, may also be set to a proper fixed value according to a specification of the FeRAM or the like.

Figure 19:
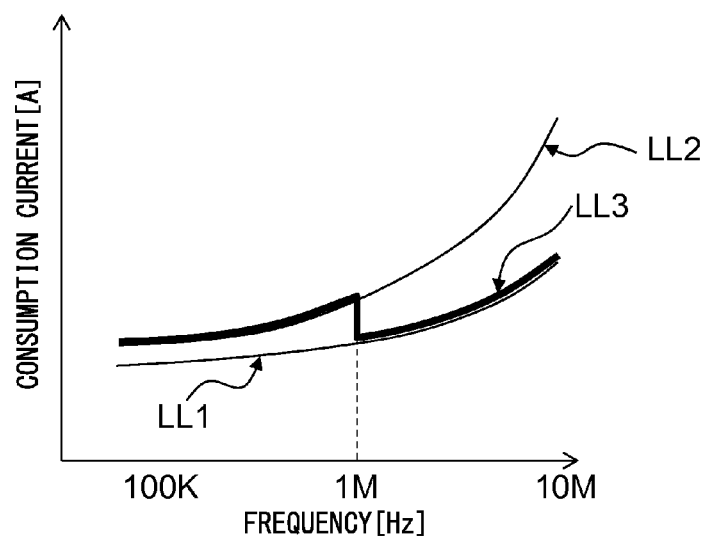
FIG. 19 is a diagram describing a reduction in power consumption by the semiconductor memory device according to the embodiment.

FIG. 19 is a diagram to describe a reduction in power consumption by the semiconductor memory device according to the embodiment. In FIG. 19, a reference symbol LL1 refers to a property when the level of the word line WL is not lowered (FIG. 6), LL2 refers to a property when the level of the word line WL is lowered (FIG. 9: when the word line WL is pre-charged), and LL3 refers to a property when the embodiment is applied.

In FIG. 19, the horizontal axis represents frequency [Hz] and the vertical axis represents consumption current [A]. Moreover, in FIG. 19, to simplify the description, it is supposed that the state transfers to a long cycle time LCT at a frequency of 1M [Hz] or less, i.e. a period when /CE="L" becomes longer than a period when DT="H", and insufficient writing to the memory cell MC caused by the leakage current IL takes place.

As illustrated by LL1 and LL2 in FIG. 19, consumption current increases as frequency rises higher in both cases but the consumption current of LL1 is smaller than the consumption current of LL2 because there is no consumption current due to charging and discharging on the word line WL. The higher the frequency is, the more eminent the difference in consumption current (the difference between LL1 and LL2) becomes.

In the LL1 case in which the level of the word line WL is not lowered, when, for example, the operating frequency is at several hundred K [Hz] (a frequency lower than 1M [Hz]), insufficient writing to a memory cell MC caused by a leakage current IL may take place. Accordingly, in order to carry out normal data writing to a memory cell MC regardless of a leakage current IL, as illustrated by LL2, processing to write data "1" is carried out after the level of the word line WL is lowered, i.e., the word line is pre-charged.

On the other hand, according to the embodiment, as illustrated by LL3 in FIG. 19, when a period in which /CE="L" is shorter than a period in which DT="H", i.e., the operating frequency is higher than 1M [Hz], for example, consumption current similar to LL1 may be achieved. According to the embodiment, when the operating frequency is at a maximum frequency (e.g. 10 [MHz]), it is possible to achieve a largest reduction in consumption current.

Moreover, according to the embodiment, when a period in which /CE="L" is longer than a period in which DT="H", i.e., the operating frequency is lower than 1M [Hz], for example, consumption current similar to LL2 may be achieved because normal data writing to a memory cell is carried out regardless of a leakage current IL. An increase in consumption current (difference between LL2 and LL1) when the operating frequency is lower than 1M [Hz] may practically not be so large.

When the time determination signal generation circuit illustrated in the above-described FIG. 14 is used, because an effect of a change in a leakage current IL due to the surrounding temperature or the like may be compensated, a margin estimated in advance may be suppressed to be small. In other words, in FIG. 19, by setting the frequency (1M [Hz]) at which LL1 and LL2 are switched to a lower frequency, it is possible to achieve a further reduction in power consumption.

In the design of power supply capacity, for example, an arrangement of smoothing capacitance in the power supply and a power supply wiring width are determined so that even a current of the circuit operating at the maximum frequency may be supplied stably. By applying the above-described embodiment, consumption current at the maximum frequency may be reduced, and, for example, it is possible to maintain a stable power supply voltage without widening power supply wiring width compared with a case in which the level of the word line is lowered for all operating frequencies.

The embodiment is not limited to an FeRAM but may be applied to other various semiconductor memory devices including a DRAM.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor memory device, comprising:
   a memory cell array configured to include a plurality of memory cells;
   a word line decoder configured to control selection and a voltage level of a word line connected to each of the memory cells;
   a time determination signal generation circuit configured to generate a time determination signal indicating a determination time, the determination time being a reference by which a change in a command is determined; and
   a timing circuit configured to determine the change in the command from the time determination signal and generate a control signal which controls whether or not a selected word line is pre-charged,
   wherein the control of whether or not a selected word line is pre-charged is carried out when, after a write command is output, the write command to write first data is output by setting a potential of a bit line connected to the memory cell to a power supply voltage and setting a potential of a plate line connected to the memory cell to a ground potential, and
   wherein the control of whether or not a selected word line is pre-charged is carried out when the first data is written after second data that are different from the first data have been written to all of the memory cells.

2. The semiconductor memory device according to claim 1, wherein the time determination signal generation circuit is installed in the timing circuit.

3. The semiconductor memory device according to claim 1, wherein the control signal controls a decoder circuit in the word line decoder.

4. The semiconductor memory device according to claim 1, wherein the change in a command corresponds to a cycle time with which the memory cell is accessed.

5. The semiconductor memory device according to claim 1, wherein the semiconductor memory device further comprises a column line decoder configured to control selection of a bit line connected to each of the memory cells.

6. The semiconductor memory device according to claim 5, wherein:
   the semiconductor memory device is a ferroelectric memory, and
   the semiconductor memory device further comprises a plate line decoder configured to control selection of a plate line connected to each of the memory cells.

7. The semiconductor memory device according to claim 6, wherein the memory cells each comprise a 1T1C-type ferroelectric memory cell which contains a transistor and a capacitor.

8. The semiconductor memory device according to claim 1, wherein the command is a chip enable signal.

9. A semiconductor memory device, comprising:
   a memory cell array configured to include a plurality of memory cells;
   a word line decoder configured to control selection and a voltage level of a word line connected to each of the memory cells;
   a time determination signal generation circuit configured to generate a time determination signal indicating a determination time, the determination time being a reference by which a change in a command is determined; and
   a timing circuit configured to determine the change in the command from the time determination signal and generate a control signal which controls whether or not a selected word line is pre-charged, wherein the timing circuit compares a chip enable signal with the time determination signal and pre-charges the selected word line when an enable time by the chip enable signal is longer than the determination time by the time determination signal.

10. A semiconductor memory device, comprising:
   a memory cell array configured to include a plurality of memory cells;
   a word line decoder configured to control selection and a voltage level of a word line connected to each of the memory cells;

a time determination signal generation circuit configured to generate a time determination signal indicating a determination time, the determination time being a reference by which a change in a command is determined; and a timing circuit configured to determine the change in the command from the time determination signal and generate a control signal which controls whether or not a selected word line is pre-charged, wherein the time determination signal generation circuit further comprises a word line decoder monitoring circuit configured to monitor a leakage current in the word line decoder, and generate the time determination signal by using an output signal of the word line decoder monitoring circuit.

11. A semiconductor memory device, comprising:

a memory cell array configured to include a plurality of memory cells;

a word line decoder configured to control selection and a voltage level of a word line connected to each of the memory cells;

a time determination signal generation circuit configured to generate a time determination signal indicating a determination time, the determination time being a reference by which a change in a command is determined; and a timing circuit configured to determine the change in the command from the time determination signal and generate a control signal which controls whether or not a selected word line is pre-charged, wherein the time determination signal generation circuit further comprises a differential amplifier configured to define the determination time in the time determination signal by comparing a gate voltage of a transfer gate transistor connected to the word line with a reference voltage, the word line being monitored by the word line decoder monitoring circuit.

12. The semiconductor memory device according to claim 11, wherein a potential of the reference voltage is configured to be adjustable.

13. The semiconductor memory device according to claim 1, wherein the word line decoder is configured to boost a gate voltage of a transfer gate transistor connected to the selected word line in a plurality of steps.

* * * * *